United States Patent
Motamedi et al.

(10) Patent No.: US 10,198,389 B2
(45) Date of Patent: Feb. 5, 2019

(54) BASEBOARD INTERCONNECTION DEVICE, SYSTEM AND METHOD

(71) Applicant: CAVIUM, INC., San Jose, CA (US)

(72) Inventors: Amir H. Motamedi, Sunnyvale, CA (US); Nikhil Jayakumar, Sunnyvale, CA (US); Bhagavathi R. Mula, San Jose, CA (US); Vivek Trivedi, Fremont, CA (US); Vasant K. Palisetti, Santa Clara, CA (US); Daman Ahluwalia, Los Gatos, CA (US)

(73) Assignee: Cavium, LLC, San Jose, CA (US)

( * ) Notice: Subject to any disclaimer, the term of this patent is extended or adjusted under 35 U.S.C. 154(b) by 772 days.

(21) Appl. No.: 14/331,105

(22) Filed: Jul. 14, 2014

(65) Prior Publication Data

US 2016/0012006 A1 Jan. 14, 2016

(51) Int. Cl.
*G06F 13/40* (2006.01)
*H05K 7/10* (2006.01)
*G06F 11/32* (2006.01)

(52) U.S. Cl.
CPC ........ *G06F 13/4068* (2013.01); *G06F 11/328* (2013.01); *G06F 13/4004* (2013.01); *G06F 13/409* (2013.01); *H05K 7/10* (2013.01)

(58) Field of Classification Search
CPC . H05K 7/02; H05K 7/026; H05K 7/10; G06F 11/32; G06F 11/324; G06F 11/325; G06F 11/328; G06F 13/40; G06F 13/4004; G06F 13/4027; G06F 13/4063; G06F 13/4068; G06F 13/409; G02B 6/36; G02B 6/3608; G02B 6/42; G02B 7/00
See application file for complete search history.

(56) References Cited

U.S. PATENT DOCUMENTS

| | | | | |
|---|---|---|---|---|
| 5,069,522 A | * | 12/1991 | Block | H04B 10/50 385/39 |
| 5,850,225 A | * | 12/1998 | Cosman | G06T 3/005 345/427 |
| 7,587,115 B1 | * | 9/2009 | Thorson | G02B 6/43 385/135 |
| 8,131,902 B2 | * | 3/2012 | Karstens | G06F 1/183 345/649 |
| 8,559,170 B2 | * | 10/2013 | Lee | G06F 1/185 361/679.32 |
| 9,367,106 B2 | * | 6/2016 | Alshinnawi | G06F 1/183 |

(Continued)

OTHER PUBLICATIONS

Homer, Rita. "Demystifying 40 Gigabit Ethernet Physical Layer Interfaces in Data Centers". Synopsys. Apr.-May 2014. (Year: 2014).*

(Continued)

*Primary Examiner* — Thomas J Cleary
(74) *Attorney, Agent, or Firm* — Haverstock & Owens LLP

(57) ABSTRACT

An information processing system, device and method wherein a base board is configured to couple to both back and midplane systems as well as optical modules for use in a data center rack system. Specifically, a base board adapter is configured to electrically couple to an integrated backplane/midplane electronic interface of the base board and translate the signals to one or more optical interface module connectors such that one or more optical interface modules are able to be coupled to the base board.

25 Claims, 5 Drawing Sheets

(56) References Cited

U.S. PATENT DOCUMENTS

| | | | |
|---|---|---|---|
| 2003/0003804 A1* | 1/2003 | Letourneau | H01R 12/714 439/607.08 |
| 2003/0086644 A1* | 5/2003 | Bhalla | H04J 3/04 385/24 |
| 2004/0117526 A1* | 6/2004 | Benson | G06F 13/409 710/107 |
| 2005/0048805 A1* | 3/2005 | Budny | H01R 12/52 439/65 |
| 2007/0230118 A1 | 10/2007 | Leija | |
| 2008/0199132 A1* | 8/2008 | Pitwon | G02B 6/4249 385/53 |
| 2010/0169559 A1* | 7/2010 | Harari | G06F 13/4068 711/103 |
| 2011/0188815 A1* | 8/2011 | Blackwell, Jr. | H05K 1/11 385/88 |
| 2011/0318011 A1* | 12/2011 | Brassil | H04J 14/02 398/82 |
| 2013/0265706 A1 | 10/2013 | Skirmont | |
| 2014/0344534 A1* | 11/2014 | Kato | G06F 3/0604 711/154 |
| 2015/0363481 A1* | 12/2015 | Haynes | G06Q 10/10 707/748 |

OTHER PUBLICATIONS

"SC Product Specification". Issue 1. OFS Fitel. Mar. 2002 (Issued Apr. 2002). (Year: 2002).*

Arsovski, et al., " A Ternary Content Addressable Memory (TCAM) Based on 4T Static Storage and Including a Current-Race Sensing Scheme", IEEE Journal of Solid State Circuits, 38 (1) Jan. 2003, pp. 155-158.

* cited by examiner

BASEBOARD INTERCONNECTION DEVICE, SYSTEM AND METHOD

FIELD OF THE INVENTION

The present invention relates to the field of network devices. In particular, the present invention relates to the interconnection of baseboards in backplane and datacenter systems.

BACKGROUND OF THE INVENTION

There are three main types of chassis for supporting and connecting data systems. Specifically, there are rack chassis which are used in data centers and include a plurality of shelves to house one or more blade servers. Further, there are backplane and midplane chassis for use with printed circuit board cards in, for example, traditional edge or core systems. Currently, the cards or blades for use in the different systems are limited such that they are only able to couple with either rack chassis or backplane/midplane chassis, not both. As a result, these blades/cards are system dependent and switch to new types of systems and/or operating two types of systems creates significant costs because the cards/blades need to be replaced and/or duplicated in order to support the desired systems.

SUMMARY OF THE INVENTION

Embodiments of the invention are directed to an information processing system, device and method wherein a base board is configured to couple to both back and midplane systems as well as optical modules for use in a data center rack system. Specifically, a base board adapter is configured to electrically couple to an integrated backplane/midplane electronic interface of the base board and translate the signals to one or more optical interface module connectors such that one or more optical interface modules are able to be coupled to the base board. As a result, the base board adapter enables the base board to operate in both data center and back/midplane systems thereby increasing the versatility of the base board.

A first aspect is directed to an information processing system. The information processing system comprises at least one base board having a rigid substrate supporting a central processing unit, a memory and a network interconnect interface, wherein the network interconnect interface is positioned along a first edge of the base board and configured to electrically couple to a backplane chassis, one or more optical interface modules each having a module connector and one or more cable connectors and a base board adapter having a base board connector configured to detachably electrically couple to the network interconnect interface and one or more optical connectors each configured to detachably electrically couple to one of the module connectors. In some embodiments, the base board further comprises one or more first visual indicators positioned along the first edge and one or more second visual indicators positioned along a second edge of the base board that is opposite the first edge. In some embodiments, the second visual indicators mirror the first visual indicators. In some embodiments, the first visual indicators indicate one or more of the group consisting of a traffic flow status, a power status and health status. In some embodiments, the base board further comprises an indicator switch that in a first state enables the operation of the first visual indicators and disables the operation of the second visual indicators and in a second state disables the operation of the first visual indicators and enables the operation of the second visual indicators. In some embodiments, the system further comprises a first user control interface positioned along the first edge and a second user control interface positioned along the second edge of the base board. In some embodiments, the optical connectors are positioned on a first side of the adapter and the base board connector is on a second side of the adapter opposite the first side. In some embodiments, the optical connectors are organized into the plurality of vertically stacked rows on the first side such that first row of optical connectors is positioned above a second row of the connectors. In some embodiments, the system further comprises a data center chassis having a top of rack switch and configured to electrically couple with the optical interface modules via one or more optical cables coupled between the cable connectors and the top of rack switch.

A second aspect is directed to a base board for use in a information processing system. The base board comprises a rigid substrate, a central processing unit positioned on the rigid substrate, a memory positioned on the rigid substrate and electrically coupled with the central processing units, a network interconnect interface electrically coupled with the central processing unit, positioned along a first edge of the substrate and configured to electrically couple to a backplane chassis, one or more first visual indicators positioned along the first edge of the substrate and one or more second visual indicators positioned along a second edge of the rigid substrate that is opposite the first edge. In some embodiments, the second visual indicators mirror the first visual indicators. In some embodiments, the first visual indicators indicate one or more of the group consisting of a traffic flow status, a power status and health status. In some embodiments, the base board further comprises an indicator switch that in a first state enables the operation of the first visual indicators and disables the operation of the second visual indicators and in a second state disables the operation of the first visual indicators and enables the operation of the second visual indicators. In some embodiments, the base board further comprises a first user control interface positioned along the first edge and a second user control interface positioned along the second edge. In some embodiments, the base board further comprises a base board adapter having a base board connector and one or more optical connectors, wherein the adapter is detachably electrically coupled to the network interconnect interface via the base board connector, wherein the optical connectors are each configured to electrically couple to a module connector of an optical interface module. In some embodiments, the optical connectors are positioned on a first side of the adapter and the base board connector is on a second side of the adapter opposite the first side. In some embodiments, the optical connectors are organized into the plurality of vertically stacked rows on the first side such that first row of optical connectors is positioned above a second row of the connectors. In some embodiments, the base board further comprises one or more optical interface modules detachably electrically coupled to the optical connectors via one or more module connectors.

A third aspect is directed to a base board adapter for use in a information processing system. The base board adapter comprises a rigid body having a first side and a second side opposite the first side, a base board connector positioned on the first side and configured to detachably electrically couple with a base board and one or more optical connectors positioned on the second side and each configured to detachably electrically couple to a module connector of an optical interface module. In some embodiments, the optical connectors are organized into the plurality of vertically stacked rows on the first side such that first row of optical connectors is positioned above a second row of the connectors.

A fourth aspect is directed to a method of providing a base board for use in an information processing system. The method comprises providing at least one base board having a rigid substrate supporting a central processing unit, a memory and a network interconnect interface, wherein the network interconnect interface is positioned along a first edge of the base board and configured to electrically couple to a backplane chassis, providing one or more optical interface modules each having a module connector and one or more cable connectors and detachably electrically coupling the optical interface modules to the base board with a base board adapter having a base board connector configured to electrically couple to the network interconnect interface and one or more optical connectors each configured to electrically couple to one of the module connectors. In some embodiments, the base board further comprises one or more first visual indicators positioned along the first edge and one or more second visual indicators positioned along a second edge of the base board that is opposite the first edge. In some embodiments, the second visual indicators mirror the first visual indicators. In some embodiments, the first visual indicators indicate one or more of the group consisting of a traffic flow status, a power status and health status. In some embodiments, the base board further comprises an indicator switch that in a first state enables the operation of the first visual indicators and disables the operation of the second visual indicators and in a second state disables the operation of the first visual indicators and enables the operation of the second visual indicators. In some embodiments, the base board further comprises a first user control interface positioned along the first edge and a second user control interface positioned along the second edge of the base board. In some embodiments, the optical connectors are positioned on a first side of the adapter and the base board connector is on a second side of the adapter opposite the first side. In some embodiments, the optical connectors are organized into the plurality of vertically stacked rows on the first side such that first row of optical connectors is positioned above a second row of the connectors. In some embodiments, the method further comprises providing a data center chassis having a top of rack switch and configured to electrically couple with the optical interface modules via one or more optical cables coupled between the cable connectors and the top of rack switch.

DETAILED DESCRIPTION OF THE PRESENT INVENTION

Embodiments of the information processing system, device and method comprise at least one base board having a rigid substrate supporting a central processing unit, a memory and a network interconnect interface. The network interconnect interface is positioned along a first edge of the base board and configured to electrically couple to a backplane chassis. A base board adapter having a base board connector is configured to detachably electrically couple to the network interconnect interface to one or more optical interface modules via one or more optical connectors. As a result, the adapter enables the base board to electrically couple with both back/midplane systems via the network interconnect interface as well as data center rack systems via the adapter-coupled optical interface modules.

Figure 1A:
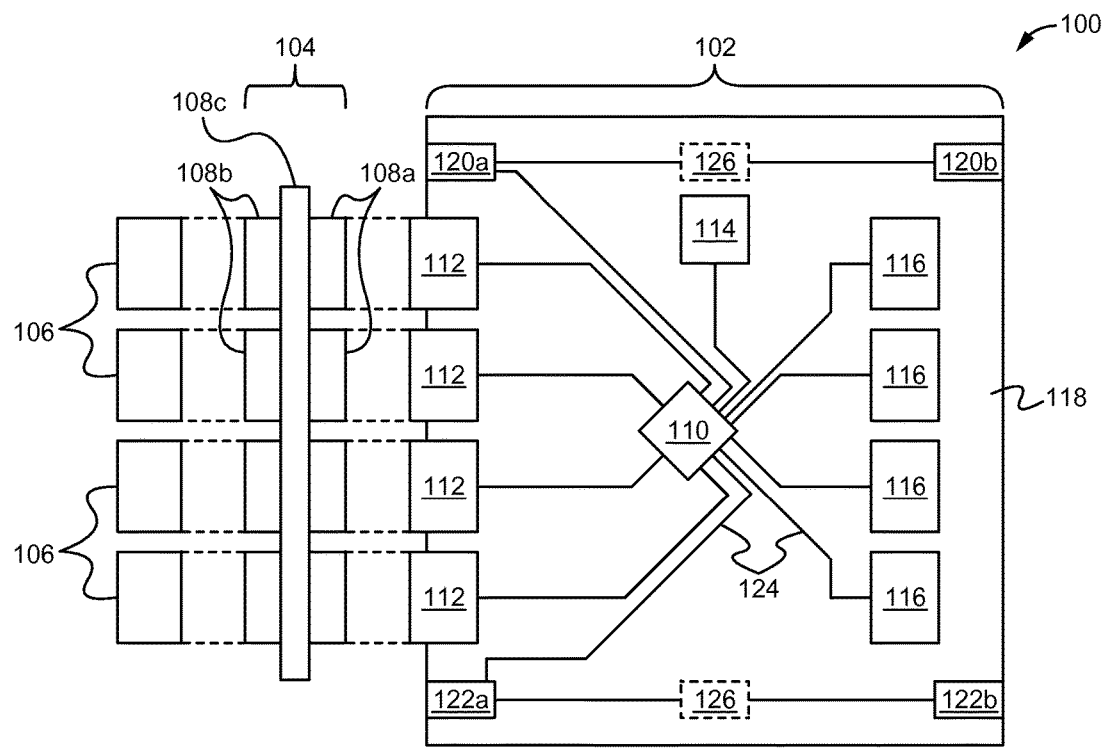
FIG. 1A illustrates a top view of a base board system according to some embodiments.
Figure 1B:
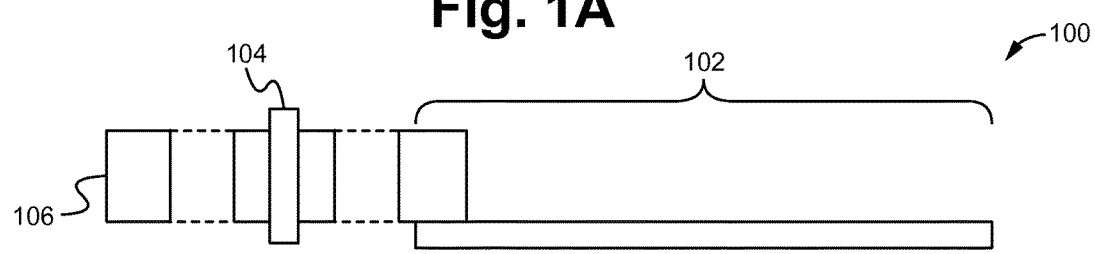
FIG. 1B illustrates a side view of a base board system according to some embodiments.

FIG. 1A illustrates a top view and FIG. 1B illustrates a side view of a base board system 100 according to some embodiments. As shown in FIGS. 1A and 1B, the base board system 100 comprises a base board 102, a base board adapter 104 and one or more optical interface modules 106. The base board 102 and the optical interface modules 106 are both able to be electrically and/or physically detachably coupled to the adapter 104. Alternatively, the optical interface modules 106 are able to be permanently electrically and/or physically coupled to the base board adapter 104. Although as shown in FIGS. 1A and 1B, the base board 102 and adapter 104 are coupled with four optical interface modules 106, any number of optical modules 106 are contemplated. In particular, the number of connectors on either side of the adapter 104 is able to be adjusted based on the number of optical interface modules 106 and/or the number of network connector interfaces on the base board 102, and vice versa.

The base board 102 is able to be a blade, blade card, blade board, line card, switch fabric or other type of information processing circuit for use in a data processing system as described herein. For example, the base board 102 is able to be a processing circuit on a printed circuit board that requires electrical and/or physical coupling to an information processing system (e.g. data center, back/midplane system) in order to receive power, cooling and/or networking functions. As shown in FIG. 1A, the base board 102 comprises a board substrate 118 physically supporting a central processing unit (cpu) or chip 110, one or more network interconnects 112, a memory 114, one or more drivers 116, one or more user control components 120a, b, one or more signalization components 122a, b and/or one or more mode switching elements 126. Alternatively, one or more of the above components are able to be omitted. Additionally, it is understood that the base board 102 is able to comprise more or less components well known in the art which have been omitted here for the sake of brevity. The substrate 118 comprises one or more electrical traces 124 that electrically couple together one or more of the cpu 110, the network interconnects 112, the memory 114, the drivers 116, the i/o cards 118, the user control components 120a, b, the signalization components 122a, b and/or the mode switching elements 126 for operation. In particular, the cpu 110 is electrically coupled to each of the network interconnects 112 such that the cpu 110 is able to receive data from and transmit data to coupled information processing systems (e.g. data center systems, backplane systems, midplane systems) as described below. In some embodiments, the network interconnects 112 are configured to couple to a midplane or back plane electrical connector as are well known in the art. As a result, the base board 102 is able to be electrically and/or physically coupled to a backplane or midplane system via the network interconnects 112 in order to be incorporated into and process data within the system. Alternatively, the network interconnects 112 are able to comprise other types of electrical interconnections known in the art.

The user control components 120a, b are able to comprise a user control interface that enables a user to turn the board 102 on and off, reset the board 102 and/or provide other commands to the board 102 by physically interacting with the control components 120a, b. The signalization components 122a, b are able to comprise one or more visual indicators (e.g. light emitting diodes) that visually indicate if the base board 102 is operating properly, a data traffic flow status, a power status, a connectivity status and/or other statuses about the operation of the base board 102 known in the art. As shown in FIG. 1A, the control component 120a and the signalization component 122a are positioned on a first side of the board 102 near the interconnects 112 whereas the control component 120b and the signalization component 122b are positioned on a second side of the board 102 opposite the interconnects 112. Specifically, the components 120a, 122a on the first side are able to provide their functionality when the board 102 is coupled to and used in a data center rack system where the first side is exposed to a user. Similarly, the components 120b, 122b on the second side are able to provide their functionality when the board 102 is coupled to and used in a back plane or midplane system where the first side is coupled to the back/midplane and the second side is exposed to a user. As a result, the signalization and/or control functionality provided by the components 120, 122 is able to be provided by the board 102 in either type of system. In some embodiments, all of the functionality provided by the control components 120 and/or signalization components 122 on one of the sides is duplicated or mirrored on the other side. Alternatively, one of the sides is able to provide less or different functionality than the other side.

If the functionality is desired to be duplicated on either side, the components 122 and/or 120 on both sides are able to be separately coupled to the cpu 110 and/or the other components of the board 102 such that the components on each side operate independently of the components on the opposite side. Alternatively, if the functionality is desired to be mirrored, the components 122 and/or 120 on one side are able to act as a master whereas the corresponding component on the opposite side will act as a slave. For example in a mirrored embodiment, commands received from the cpu 110 by the signalization component 122 on the master side are able then be forwarded to the slave side such that the slave side mirrors the master side. In contrast, in a duplicated embodiment, two separate duplicate commands are able to be separately transmitted from the cpu 110 to either side 122a, 122b. As another example in a mirrored embodiment, commands received by a user by the control component 120 on the master side are able to be directly sent to the cpu 110 (or other appropriate board component), whereas commands received by a user by the component 120 on the slave side are forwarded to the master side component 120 and then sent to the cpu 110 (or other appropriate board component). In contrast, in a duplicated embodiment, the control components 120 on both sides are able to directly transmit commands received from a user to the cpu 110 (or other appropriate board component). As shown in FIG. 1A, in the mirrored or master/slave embodiments, the components 120a and 120b and/or 122a and 122b are able to be electrically coupled together. Alternatively, with regard to the signalization components 122a, 122b, in the mirrored or master/slave embodiments the components 122a and 122b are able to be coupled together via light pipes such that displayed on one side will be transmitted and displayed on the other side as well. Alternatively or in addition, in the duplicate embodiments, the components 120a and 120b and/or 122a and 122b are able to be independently electrically coupled to the cpu 110 (or other appropriate board component).

In some embodiments, the base board 102 comprises one or more mode switch elements 126 electrically coupled with one or more of the components 120 and/or 122. In such embodiments, when the switch elements 126 are activated in a first state, they are able to disable the operation of the control component 120a and/or signalization component 122a on one side and enable the operation of the control component 120b and/or signalization component 122b on one side, and vice versa when activated in a second state. As a result, the switch elements 126 enable a user to selectively switch between the components 120, 122 on one side and the other side depending on which type of information processing system the board 102 is being used in. In some embodiments, a single switch element 126 is coupled with and switches between both the control and the signalization components 120, 122. Alternatively, two separate switch elements 126 are able to be used such that the control components 120 and the signalization components 122 are able to be separately switched by a corresponding separate switch element 126. In some embodiments, the switch elements 126 are physical switches. Alternatively, the switch elements 126 are able to be virtual switches and or other multi-mode elements known in the art. Alternatively, the switch elements 126 are able to be omitted. Alternatively, one of the control components 120a, 120b and/or one of the signalization components 122a, 122b are able to be omitted such that only a single side of the board 102 comprises a control and/or signalization component.

The base board adapter 104 is able to comprise a midplane board 108c, wherein the first side of the board 108c comprises one or more base board interfaces 108a and the second side of the board 108c comprises one or more optical module interfaces 108b. The base board interfaces 108a are configured to electrically/physically detachably couple to network interconnects of the base board 102. The optical module interfaces 108b are configured to electrically/physically detachably couple to optical interconnects of the modules 106. Further, the midplane board 108c is able to comprise one or more electrical traces and/or vias (not shown) that electrically couple the electrical connections/contact pads of the base board interfaces 108a to the electrical connections/contact pads of the optical module interfaces 108b. As a result, the adapter 104 is able to be selectively attached to the base board 102 in order to enable to base board 102 to electrically and physically couple with one or more optical modules 106 for use in a data center information processing system. In some embodiments, the base board interfaces 108a are substantially similar to mid and/or back plane system electrical and/or mechanical interfaces as known in the art. Alternatively, the base board interfaces 108a are able to comprise other types of electrical and/or mechanical interfaces for electrically and or mechanically coupling to the network interconnects of the base board 102.

The optical interface modules 106 are each able to comprise hardware, firmware, and/or software logic that couple together optical lines/cables (see FIG. 2A) and electrical contacts (e.g. optical module interface 108b contacts) for transmission and receipt of communications from the electrical contacts using optical signals. Specifically, each of the optical interface modules 106 are able to comprise electrical contacts for electrically coupling to the electrical contacts, optical contacts for coupling to the optical lines, and optical/electrical converters (not shown) that convert information between electrical signals (e.g. received from the electrical contacts) to optical signals (e.g. for transmission on the optical cables to and through an information processing system). For example, the optical interface modules 106 are able to communicate optical signals encoding bit streams on optical lines and communicate electrical signals encoding the bit streams. In some embodiments, the optical interface modules 106 each have two optical interfaces that provide full duplex capabilities. In some embodiments, the electrical contacts are standard connectors such as nine-pin D-subminiature connectors, PCMCIA connectors, or other suitable connectors for coupling with the adapter 104 and/or base boards 102.

Figure 1C:
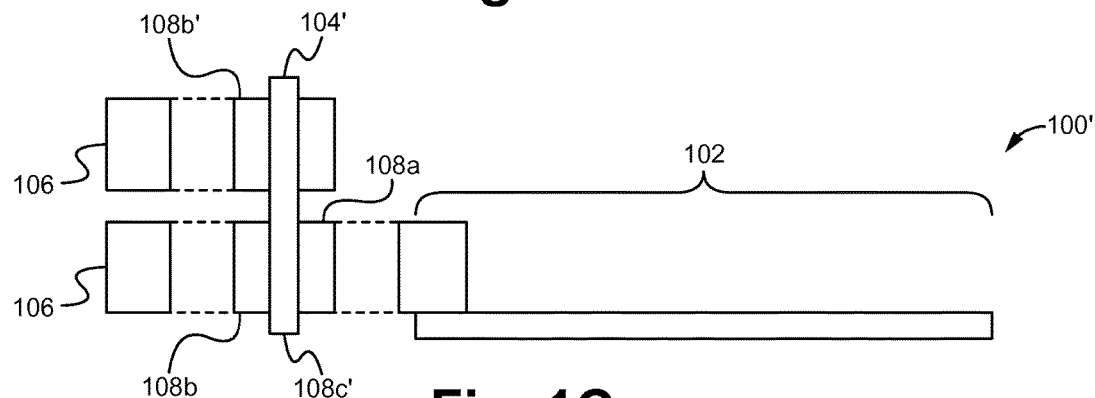
FIG. 1C illustrates a side view of a base board system for a 2 rack unit according to some embodiments.

FIG. 1C illustrates a side view of a base board system 100' for a 2 rack unit (RU) according to some embodiments. The system 100' of FIG. 1C is substantially similar to the system 100 of FIGS. 1A and 1B except for the differences described herein. Specifically, as shown in FIG. 1C, the midplane board 108c' of the base board adapter 104' is extended such that one or more second or upper rows of optical module interfaces 108b' are able to be stacked on top of the first or bottom row 108b of the adapter 104'. Like the first row of optical module interfaces 108b, the one or more second rows 108b' are configured to electrically/physically detachably couple to optical interconnects of the modules 106. Further, the extended midplane board 108c' is able to comprise one or more upper electrical traces and/or vias (not shown) that electrically couple the electrical connections/contact pads of the base board interfaces 108a to the electrical connections/contact pads of the first and second optical module interfaces 108b, 108b'. As a result, the adapter 104' is able to be selectively attached to the base board 102 in order to enable to base board 102 to electrically and physically couple with one or more vertical rows of optical modules 106 for use in a data center information processing system. Although as shown in FIG. 1C, the extended midplane board 108c' only comprises a single second or upper row 108b', a plurality of upper rows 108b' each stacked vertically on top of the previous rows are contemplated. Additionally, although in FIGS. 1A-C each row 108b, 108b' comprises four optical module interfaces, each row is able to comprise more or less interfaces. Similarly, although in FIGS. 1A-C each row 108b comprises four base board interfaces, each row is able to comprise more or less interfaces. For example, there is able to be one base board interface 108a for each network interconnect 112 and/or one or more optical module interface 108b, 108b' for each base board interface 108a.

Figure 2A:
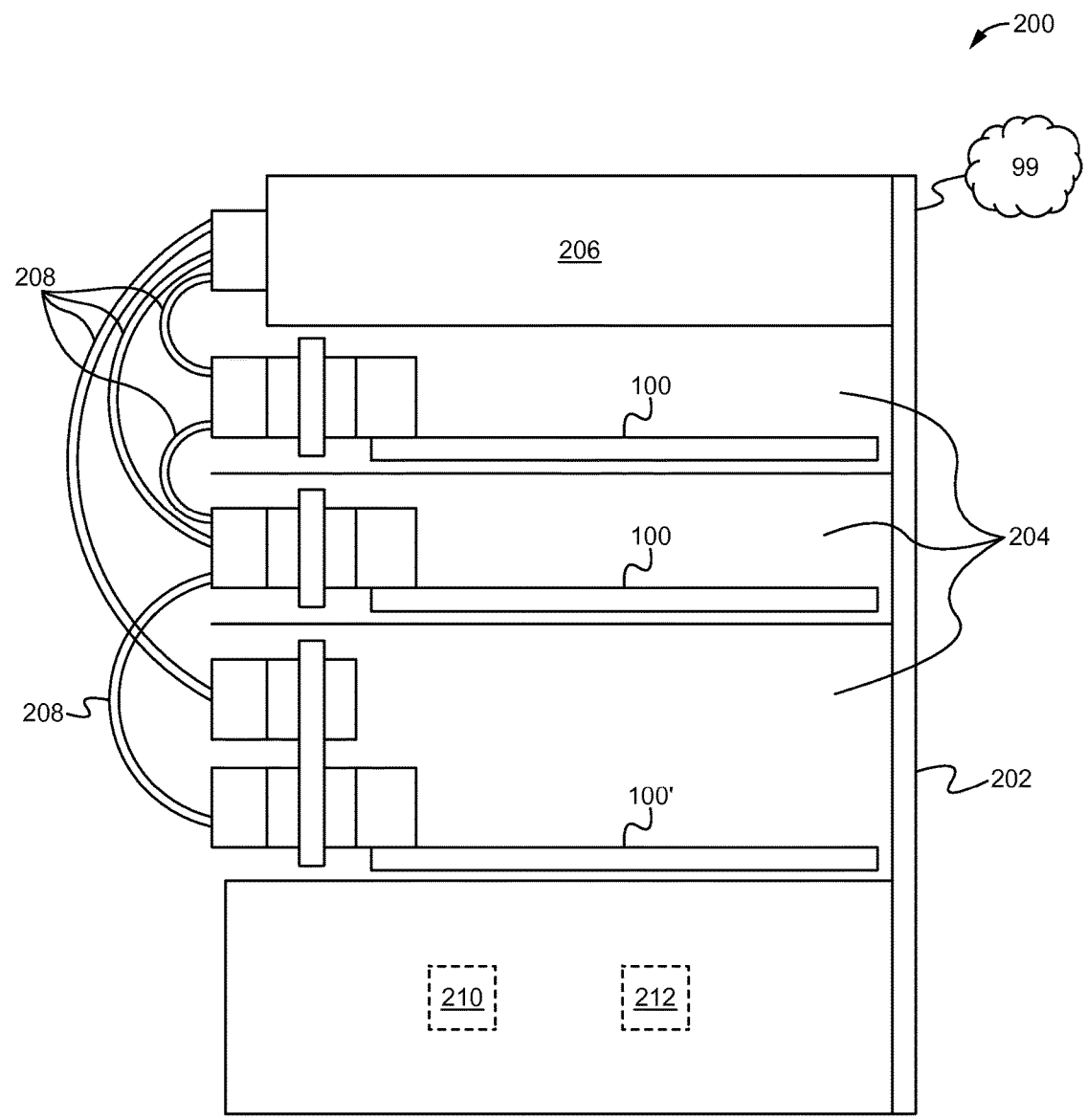
FIG. 2A illustrates an information processing system according to some embodiments.

FIG. 2A illustrates an information processing system 200 according to some embodiments. As shown in FIG. 2A, the information processing system 200 comprises a chassis 202, one or more base board systems 100, 100', a top of rack (TOR) switch 206 and one or more optical cables or lines 208. In some embodiments, the information processing system 200 also comprises a power source 210 for providing power to the system 200 and/or a cooling mechanism 212 for controlling the temperature of the board systems 100, 100' and/or the remainder of the system 200. The chassis 202 is able to be a rack having one or more shelves or compartments 204, wherein the shelves 204 physically couple to and house the TOR switch 206, the base board systems 100, 100', the power source 210 and/or the cooling mechanism 212. In particular, the board systems 100, 100' are able to be removably physically coupled to the shelves 204 of the rack 202 physically (e.g. via one or more rails) such that board systems 100, 100' are each able to be added, removed or swapped as desired. The base board systems 100, 100' are each able to be electrically and/or optically communicatively coupled to each other and/or the TOR switch 206 via the optical cables 208 coupled to the optical contacts/interconnects of the optical interface modules 106 of the systems 100, 100'. As a result, the base board systems 100, 100' are able to exchange data with the other boards and/or the switch 206, as well as with one or more networks 99 coupled with the switch 99. The networks 99 are able to comprise the internet, a local area network or another type of wired and/or wireless network. In some embodiments, the networks 99 include one or more additional information processing systems similar to the system 200 shown in FIG. 2A such that multiple systems (and the boards/switches therein) are able to communicate and together form a larger processing system (e.g. processing farm).

Figure 2B:
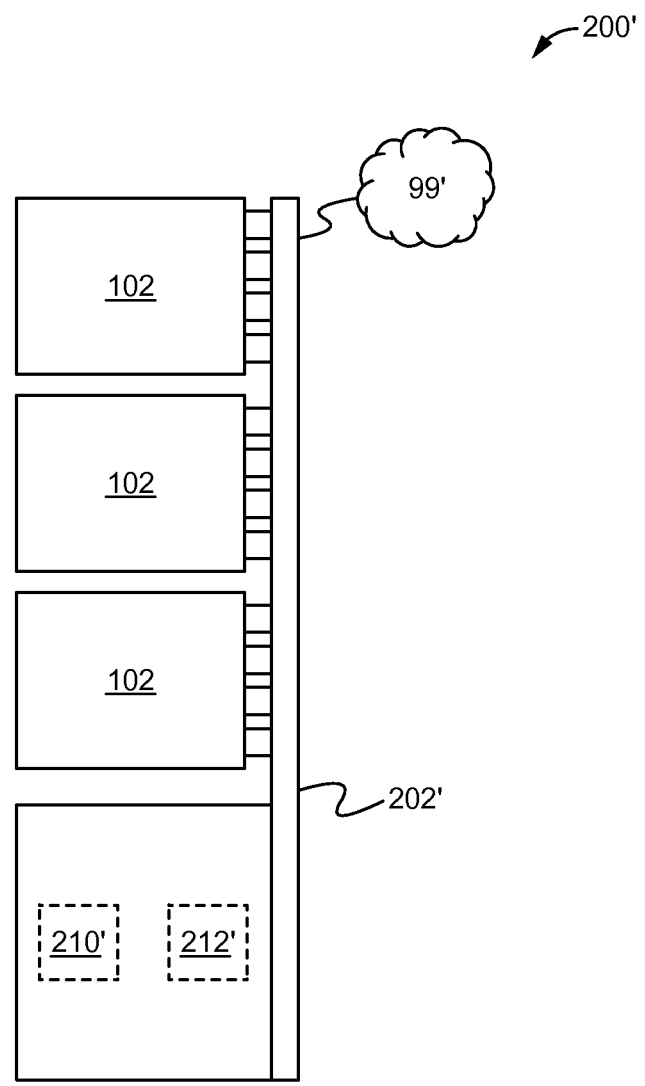
FIG. 2B illustrates an information processing system according to some embodiments.

FIG. 2B illustrates an information processing system 200' according to some embodiments. As shown in FIG. 2B, the information processing system 200' comprises a chassis 202' and one or more base boards 102 which are able to be used as vertical line cards and/or vertical switch fabric. In some embodiments, the information processing system 200' also comprises a power source 210' for providing power to the system 200' and/or a cooling mechanism 212' for controlling the temperature of the boards 102 and/or the remainder of the system 200'. The chassis 202' is able to be a backplane, wherein the backplane is configured to physically and/or electrically couple to the boards 102, the power source 210 and/or the cooling mechanism 212. Specifically, the backplane chassis 202' is able to couple to the network interconnects 112 of the boards 102 when the adapter 104 and optical interface modules 106 are removed. For example, in some embodiments the backplane chassis 202' is able to comprise a group of electrical connectors in parallel with each other, so that each pin of each connector is linked to the same relative pin of all the other connectors forming a computer bus. Additionally, the backplane 202' is able to comprise switch fabric including one or more switches (e.g. crossbar switches) electrically coupled to the back plane chassis 202' and electrically communicatively coupling the boards 102 used a line cards together. Further, the boards 102 are able to be removably physically and/or electrically coupled to the backplane chassis 202' such that boards 102 are each able to be added, removed or swapped as desired. As a result, the backplane is able to electrically couple each of the base boards 102 to each other for exchanging data with the other boards 102 and/or one or more networks 99' coupled with the backplane. Like in the system 200, the networks 99' are able to comprise the internet, a local area network or another type of wired and/or wireless network. In some embodiments, the networks 99' include one or more additional information processing systems similar to the system 200' shown in FIG. 2B such that multiple systems (and the boards/switches therein) are able to communicate and together form a larger processing system (e.g. processing farm). Although as shown in FIG. 2B, all of the line card and switching fabric functions are performed by the boards 102, it is understood that one or more of the boards 102 performing the line card and/or switching fabric functions are able to be replaced with standard cards/switching fabric as are well known in the art.

Figure 2C:
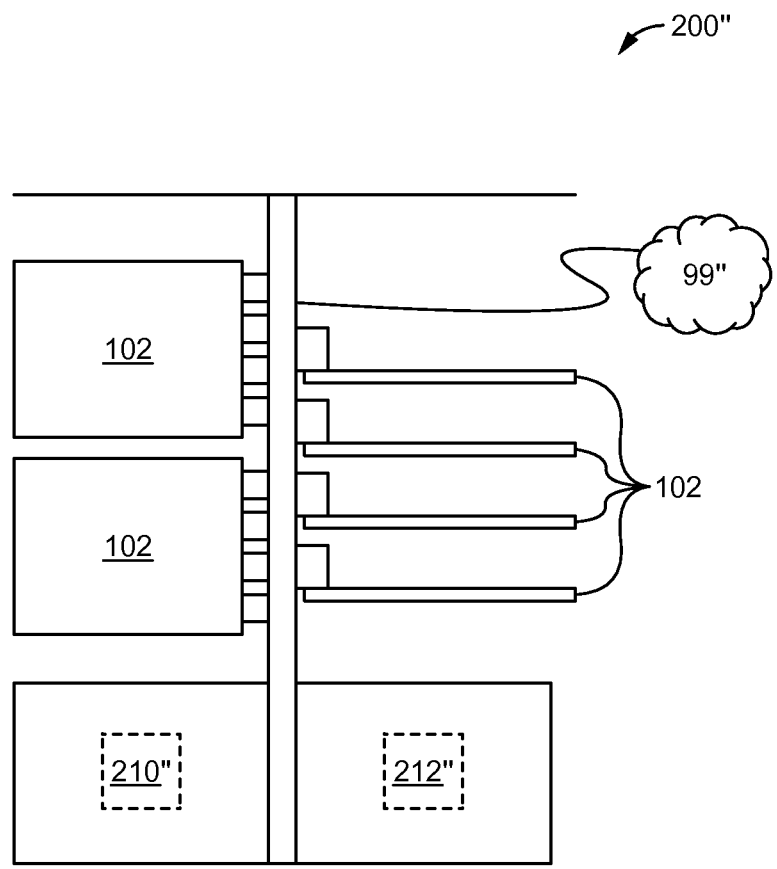
FIG. 2C illustrates an information processing system according to some embodiments.

FIG. 2C illustrates an information processing system 200" according to some embodiments. As shown in FIG. 2C, the information processing system 200" comprises a chassis 202" and one or more base boards 102 which are able to be used as vertical line cards and/or orthogonal horizontal switch fabric. In some embodiments, the information processing system 200" also comprises a power source 210" for providing power to the system 200" and/or a cooling mechanism 212" for controlling the temperature of the boards 102 and/or the remainder of the system 200". The chassis 202" is able to be a midplane, wherein the midplane is configured to physically and/or electrically couple to the boards 102, the power source 210 and/or the cooling mechanism 212. In particular, the midplane chassis 202" is able to be substantially similar to the backplane chassis 202' except for the use of a orthogonal or horizontal switch fabric cards/boards 102 that are positioned on the opposite side of the chassis 202". Similar to the system 200', the boards 102 are able to be removably physically and/or electrically coupled to the midplane chassis 202" such that boards 102 are each able to be added, removed or swapped as desired. Specifically, the backplane chassis 202' is able to couple to the network interconnects 112 of the boards 102 when the adapter 104 and optical interface modules 106 are removed. As a result, the midplane is able to electrically couple each of the base boards 102 to each other for exchanging data with the other boards 102 and/or one or more networks 99" coupled with the midplane. Like in the systems 200 and 200', the networks 99" are able to comprise the internet, a local area network or another type of wired and/or wireless network. In some embodiments, the networks 99" include one or more additional information processing systems similar to the system 200" shown in FIG. 2C such that multiple systems (and the boards/switches therein) are able to communicate and together form a larger processing system (e.g. processing farm). Although as shown in FIG. 2C, all of the line card and switching fabric functions are performed by the boards 102, it is understood that one or more of the boards 102 performing the line card and/or switching fabric functions are able to be replaced with standard cards/switching fabric as are well known in the art.

Figure 3:
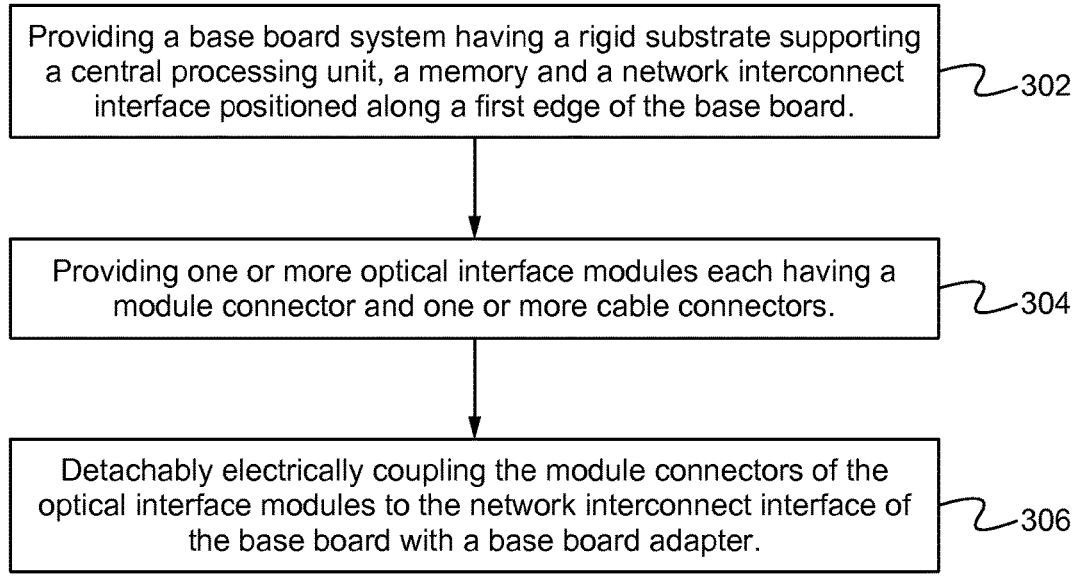
FIG. 3 illustrates a method of providing a base board system for use in an information processing system according to some embodiments.

FIG. 3 illustrates a method of providing a base board system for use in an information processing system according to some embodiments. As shown in FIG. 3, a base board system 100, 100' having a rigid substrate 118 supporting a central processing unit 110, a memory 114 and a network interconnect interface 112 positioned along a first edge of the substrate 118 is provided at the step 302. One or more optical interface modules 106 each having a module connector and one or more cable connectors are provided at the step 304. The module connectors of the optical interface modules 106 are detachably electrically coupled to the network interconnect interface 112 of the base board 102 with a base board adapter 104 at the step 306. In some embodiments, the base board system 100, 100' is electrically and/or physically coupled to a data center chassis 202 having a top of rack switch 206 via one or more optical cables 208. In some embodiments, the base board 102 of the base board system 100, 100' is electrically and/or physically decoupled from the adapter 104 and modules 106 and electrically and/or physically coupled to a midplane or backplane chassis 202', 202" via the network interconnects 112. As a result, the method provides the advantage of providing a base board system 100, 100' that is able to couple to and operate with all of data center rack systems, backplane chassis systems and midplane chassis systems.

The information processing system, device and method described herein has numerous advantages. Specifically, as described above, they provide the advantage of providing a base board system 100, 100' that is able to couple to and operate with all of data center rack systems, backplane chassis systems and midplane chassis systems. In doing so they provide the benefit of providing signaling and/or control panels on opposite sides of each base board such that both sides enable control/operation of the board. Moreover, they provide the advantage of an adapter configured for one rack, two rack or greater rack units such that it is able to be removably coupled to network interconnects designed to coupled to midplane/backplane base boards and electrically couple those interconnects to one or more rows of optical interface modules. Thus, the information processing system, device and method has many advantages.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. An information processing system, comprising:
at least one base board having a rigid substrate supporting a central processing unit, a memory and a network interconnect interface, wherein the network interconnect interface is positioned along a first edge of the base board and configured to electrically couple to a backplane chassis;
one or more optical interface modules each having a module connector and one or more cable connectors; and
a base board adapter having a base board connector configured to detachably electrically couple to the network interconnect interface and one or more optical connectors each configured to detachably electrically couple to one of the module connectors, wherein the base board further comprises one or more first visual indicators positioned along the first edge and one or more second visual indicators positioned along a second edge of the base board that is opposite the first edge.

2. The system of claim 1, wherein the second visual indicators mirror the first visual indicators.

3. The system of claim 2, wherein the first visual indicators indicate one or more of the group consisting of a traffic flow status, a power status and health status.

4. The system of claim 1, wherein the base board further comprises an indicator switch that in a first state enables the operation of the first visual indicators and disables the operation of the second visual indicators and in a second state disables the operation of the first visual indicators and enables the operation of the second visual indicators.

5. The system of claim 1, wherein the base board further comprises a first user control interface positioned along the first edge and a second user control interface positioned along the second edge of the base board.

6. The system of claim 1, wherein the optical connectors are positioned on a first side of the adapter and the base board connector is on a second side of the adapter opposite the first side.

7. The system of claim 6, wherein the optical connectors are organized into the plurality of stacked rows on the first side such that first row of optical connectors is positioned adjacent to a second row of the connectors.

8. The system of claim 1, further comprising a data center chassis having a top of rack switch and configured to electrically couple with the optical interface modules via one or more optical cables coupled between the cable connectors and the top of rack switch.

9. A base board for use in a information processing system, the base board comprising:
  a rigid substrate;
  a central processing unit positioned on the rigid substrate;
  a memory positioned on the rigid substrate and electrically coupled with the central processing units;
  a network interconnect interface electrically coupled with the central processing unit, positioned along a first edge of the substrate and configured to electrically couple to a backplane chassis;
  one or more first visual indicators positioned along the first edge of the substrate; and
  one or more second visual indicators positioned along a second edge of the rigid substrate that is opposite the first edge.

10. The base board of claim 9, wherein the second visual indicators mirror the first visual indicators.

11. The base board of claim 10, wherein the first visual indicators indicate one or more of the group consisting of a traffic flow status, a power status and health status.

12. The base board of claim 9, further comprising an indicator switch that in a first state enables the operation of the first visual indicators and disables the operation of the second visual indicators and in a second state disables the operation of the first visual indicators and enables the operation of the second visual indicators.

13. The base board of claim 9, further comprising a first user control interface positioned along the first edge and a second user control interface positioned along the second edge.

14. The base board of claim 9, further comprising a base board adapter having a base board connector and one or more optical connectors, wherein the adapter is detachably electrically coupled to the network interconnect interface via the base board connector, wherein the optical connectors are each configured to electrically couple to a module connector of an optical interface module.

15. The base board of claim 14, wherein the optical connectors are positioned on a first side of the adapter and the base board connector is on a second side of the adapter opposite the first side.

16. The base board of claim 15, wherein the optical connectors are organized into the plurality of vertically stacked rows on the first side such that first row of optical connectors is positioned above a second row of the connectors.

17. The base board of claim 14, further comprising one or more optical interface modules detachably electrically coupled to the optical connectors via one or more module connectors.

18. A method of providing a base board for use in an information processing system, the method comprising:
  providing at least one base board having a rigid substrate supporting a central processing unit, a memory and a network interconnect interface, wherein the network interconnect interface is positioned along a first edge of the base board and configured to electrically couple to a backplane chassis;
  providing one or more optical interface modules each having a module connector and one or more cable connectors; and
  detachably electrically coupling the optical interface modules to the base board with a base board adapter having a base board connector configured to electrically couple to the network interconnect interface and one or more optical connectors each configured to electrically couple to one of the module connectors, wherein the base board further comprises one or more first visual indicators positioned along the first edge and one or more second visual indicators positioned along a second edge of the base board that is opposite the first edge.

19. The method of claim 18, wherein the second visual indicators mirror the first visual indicators.

20. The method of claim 19, wherein the first visual indicators indicate one or more of the group consisting of a traffic flow status, a power status and health status.

21. The method of claim 18, wherein the base board further comprises an indicator switch that in a first state enables the operation of the first visual indicators and disables the operation of the second visual indicators and in a second state disables the operation of the first visual indicators and enables the operation of the second visual indicators.

22. The method of claim 18, wherein the base board further comprises a first user control interface positioned along the first edge and a second user control interface positioned along the second edge of the base board.

23. The method of claim 18, wherein the optical connectors are positioned on a first side of the adapter and the base board connector is on a second side of the adapter opposite the first side.

24. The method of claim 23, wherein the optical connectors are organized into the plurality of stacked rows on the first side such that first row of optical connectors is positioned adjacent to a second row of the connectors.

25. The method of claim 18, further comprising providing a data center chassis having a top of rack switch and configured to electrically couple with the optical interface modules via one or more optical cables coupled between the cable connectors and the top of rack switch.

* * * * *